(12) United States Patent
Verbrugge et al.

(10) Patent No.: US 7,373,264 B2
(45) Date of Patent: May 13, 2008

(54) METHOD AND APPARATUS FOR GENERALIZED RECURSIVE LEAST-SQUARES PROCESS FOR BATTERY STATE OF CHARGE AND STATE OF HEALTH

(75) Inventors: Mark W. Verbrugge, Troy, MI (US); Edward D. Tate, Jr., Grand Blanc, MI (US); Damon R. Frisch, Troy, MI (US); Brian J. Koch, Berkley, MI (US)

(73) Assignee: General Motors Corporation, Detroit, MI (US)

( * ) Notice: Subject to any disclaimer, the term of this patent is extended or adjusted under 35 U.S.C. 154(b) by 0 days.

(21) Appl. No.: 11/669,196

(22) Filed: Jan. 31, 2007

(65) Prior Publication Data

US 2007/0159137 A1 Jul. 12, 2007

Related U.S. Application Data

(62) Division of application No. 10/368,869, filed on Feb. 18, 2003.

(51) Int. Cl.
*G01R 19/00* (2006.01)

(52) U.S. Cl. ....................................................... 702/64

(58) Field of Classification Search .................. 702/63, 702/64
See application file for complete search history.

(56) References Cited

U.S. PATENT DOCUMENTS 6,359,419 B1 * 3/2002 Verbrugge et al. .......... 320/132

* cited by examiner

*Primary Examiner*—John Barlow
*Assistant Examiner*—Stephen J Cherry

(57) ABSTRACT

A method for determining a state of charge (SOC) or state of health (SOH) of a battery system includes performing a first step. The first step includes determining a set of initial values for parameters, coefficients, and derivatives based upon linear functional relationships. A result is computed based on the determination. After execution of the first step, intermediate functions are calculated based on the result. The parameters are updated based on the intermediate functions. An open circuit voltage $V_{OC}$ that has a functional relationship with a voltage-based SOC ($SOC_V$) is determined based on the updated parameters. The $SOC_V$ is extracted by inverting an expression of $V_O(SOC_V)$. A current based SOC ($SOC_C$) is calculated. A weight for weighting the $SOC_C$ and the $SOC_V$ is calculated. A SOC is calculated based on the weight. $V_O$ is a battery voltage.

18 Claims, 7 Drawing Sheets

METHOD AND APPARATUS FOR GENERALIZED RECURSIVE LEAST-SQUARES PROCESS FOR BATTERY STATE OF CHARGE AND STATE OF HEALTH

This application is a divisional application and claims the benefit of the priority of prior application Ser. No. 10/368,869, filed Feb. 18, 2003, entitled "Method and Apparatus for Generalized Recursive Least-Squares Processing for Battery State of Charge and State of Health."

TECHNICAL FIELD

This invention relates to a battery pack operating in a hybrid electrical powertrain, or a pure electric system, for a vehicle. More specifically, the present invention relates to a system and generalized method for recursively determining the state of charge, and the state of health of the battery pack.

BACKGROUND OF THE INVENTION

In today's automotive market, there exist a variety of propulsion or drive technologies used to power vehicles. The technologies include internal combustion engines (ICEs), electric drive systems utilizing batteries and/or fuel cells as an energy or power source, and hybrid systems utilizing a combination of internal combustion engines and electric drive systems, as well as pure electric systems. The propulsion systems each have specific technological, financial and performance advantages and disadvantages, depending on the state of energy prices, energy infrastructure developments, environmental laws, and government incentives.

The increasing demand to improve fuel economy and reduce emissions in present vehicles has led to the development of advanced hybrid vehicles, as well as pure electric vehicles. With regard to pure electric vehicles, no ICE is required. Electric vehicles are classified as vehicles having only one energy source, typically a battery or a hydrogen fed fuel cell. Hybrid vehicles are classified as vehicles having at least two separate energy sources, typically an internal combustion engine and a battery linked to an electric traction motor. Hybrid vehicles, as compared to standard vehicles driven by an ICE, have improved fuel economy and reduced emissions. During varying driving conditions, hybrid vehicles will alternate between separate power sources, depending on the most efficient manner of operation of each power source. For example, during most operating conditions, a hybrid vehicle equipped with an ICE and an electric motor will shut down the ICE during a stopped or idle condition, allowing the electric motor to propel the vehicle and eventually restart the ICE, improving fuel economy for the hybrid vehicle.

Hybrid vehicles are broadly classified into series or parallel drivetrains, depending upon the configuration of the drivetrains. In a series drivetrain utilizing an ICE and an electric traction motor, only the electric motor drives the wheels of a vehicle. The ICE converts a fuel source to mechanical energy to turn a generator, which converts the mechanical energy to electrical energy to drive the electric motor. In a parallel hybrid drivetrain system, two power sources such as an ICE and an electric traction motor operate in parallel to propel a vehicle. Generally, a hybrid vehicle having a parallel drivetrain combines the power and range advantages of a conventional ICE with the efficiency and electrical regeneration capability of an electric motor to increase fuel economy and lower emissions, as compared with a traditional ICE vehicle. In addition, hybrid vehicles can incorporate both series and parallel paths. Further, hybrids are often described as being either charge depleting or charge sustaining with reference to a battery pack. Charge-depleting hybrids can be charged off the electrical grid; thus, these hybrids share many of the characteristics of purely electric vehicles. In contrast, the batteries in charge-sustaining hybrids receive all of their electrical charging from the ICE.

Battery packs having secondary/rechargeable batteries are an important component of hybrid vehicle systems, as they enable an electric motor/generator (MoGen) to store braking energy in the battery pack during regeneration and charging by the ICE. The MoGen utilizes the stored energy in the battery pack to propel or drive the vehicle when the ICE is not operating. During operation, the ICE will be turned on and off intermittently, according to driving conditions, causing the battery pack to be alternatively charged and discharged by the MoGen.

State of charge (SOC) and state of health (SOH) are two terms of immediate interest with regard to battery systems. The SOC corresponds to the stored charge available to do work relative to that which is available after the battery has been fully charged; this definition is made precise in the model formulation infra. SOC can be viewed as a thermodynamic quantity, enabling one to assess the potential energy of the system. SOH is a term that is becoming more commonly used within the battery community, but which has not to date been clearly defined. Generally, SOH is used to imply that one can deduce how well the battery system is functioning relative to its nominal (rated) and end (failed) states. For our purposes, we assume that we can represent the SOH if we have a method to identify the impedance spectrum for the battery system over the frequency range of interest in an on-line (or adaptive) manner. Hence, knowing the change in the SOH with time may be viewed as enabling one to assess the increase in irreversible losses that is inherent in the aging of batteries. Thus, the thermodynamics (which are invariant over the battery system's life) allow one to assess the potential energy of the system, and irreversible losses can be assessed once the impedance spectrum is clarified.

A set of parameters can be established to characterize the impedance spectrum. The parameters can be regressed by means of a system identification scheme. The need to regress the value of all parameters that critically impact the impedance spectrum motivates the formulation of a generalized method for the system identification problem. It is noted that to merely regress a limited number of parameters and guess, or use other means to determine, the values of other parameters reduces the accuracy and efficiency in reflecting a battery system. Therefore, it is desirous to have an efficient computing means to calculate all the parameters under a single generalized method or process. The result is that the SOC and SOH of a battery can be better known to a vehicle system operator. Furthermore, it is desirous, as well, to derive a generalized method that can be applied to electric and hybrid-electric vehicles. The generalized method can be used for battery systems, which include lead acid, nickel metal hydride, lithium ion, and other promising battery systems.

As can be appreciated, the state of charge (SOC) and the state of health (SOH) of the battery pack in a vehicle system such as a hybrid vehicle system are important in relation to vehicle efficiency, emissions, and availability. In other words, the SOC and SOH of the battery system constitutes a set of critical elements for a vehicle propulsion system. For example, a vehicle operator or an onboard controller needs to know the conditions of the battery pack for regulating the same.

It is known in the art to use a look up table (LUT) to regulate a battery pack having parameters pre-computed based on a standard vehicle, or an experimental vehicle. A standard vehicle is a vehicle other than the vehicle which a vehicle operator is handling. A difficulty with the prior art approaches is that they are either not vehicle specific, or lack a generalized approach to multiple parameter handling, thereby reducing the utility of the prior art systems. In addition, it is known in the art to use Coulomb counting to obtain a SOC value of a battery system. Coulomb counting is easily implemented provided the current efficiency is known precisely for all times and conditions. Because this is not normally the case, the voltage signal can be used in a model that incorporates the voltage for determining the SOC.

SUMMARY OF THE INVENTION

The present invention provides methods that combine analytical expressions to deduce salient features of a battery system including battery resistance from past current and voltage behavior. An equivalent circuit is used to characterize the battery system. All circuit elements of the equivalent circuit are regressed by means of a fully recursive least-squares analysis from previous time-step data. The fully recursive least-squares analysis includes exponential forgetting. The method is suitable for a generalized system that incorporates a multiplicity of parameters to be regressed. The method further includes a weighting scheme, wherein some data points are giving more weight than others. For example, it is often desired to give more weight to discharge current-potential point measured during battery discharge because the discharge performance is better understood. The method also includes a skew test, wherein data points that are skewed beyond a limit are discarded, or are given less weight. Further, a traditional variance test is included in the method and used in combination with the skew test. Both diagnostic tests are fully recursive.

A first method for determining a voltage-based state of charge (SOC) and state of health (SOH) of a battery system is provided. The method includes: providing a model of the battery system including an equivalent circuit having both low frequency and high frequency elements; establishing a plurality of functional relationships comprising relationship of the equivalent circuit with SOC; reducing at least part of the plurality of functional relationships into a set of time segmented recursive functional relationships, wherein a state at a first time t can be modeled by a functional presentation of a state at a second time t−Δt that occurred before the first time t; and computing a set of data points based upon the set of time segmented recursive functional relationships using a matrix for operation in matrix algebra.

A second method for determining a state of charge (SOC) and state of health (SOH) of a battery system using a generalized regression method is provided. The method includes: determining a current-based SOC result based on Coulomb integration or Coulomb counting, wherein the Coulomb integration or counting includes self-discharge and current efficiency computations; determining a voltage-based SOC result based on measurements or previous computations as a starting point, and using a recursive adaptive filter for extracting a plurality of parameter values, including: providing a model of the battery system comprising an equivalent circuit having both low frequency and high frequency elements; establishing a plurality of functional relationships comprising relationship of the equivalent circuit with SOC; reducing at least part of the plurality of functional relationships into a set of time segmented recursive functional relationships, wherein a state at a time can be modeled by a functional presentation of a state at a time that occurred before; and computing a set of data points based upon the set of time segmented recursive functional relationships using a matrix for operation in matrix algebra; and combining the current-based SOC result and the voltage-based SOC result with a weighting factor to generate the SOC of the battery system.

A third method for determining a state of charge (SOC) and state of health (SOH) of a battery system is provided. The method includes: performing a first step including determining a set of initial values for a plurality of parameters, coefficients, and derivatives based upon a plurality of linear functional relationships, and computing a result based upon the determining; after execution of the first step, calculating a plurality of intermediate functions; updating the plurality of parameters; determining a open circuit voltage $V_o$ that possesses a functional relationship with $SOC_V$; extracting $SOC_V$ by inverting the expression of $V_o(SOC_V)$; calculating $SOC_C$; calculating a weight for weighting $SOC_C$ and $SOC_V$; and calculating SOC.

A vehicle powertrain control system is provided which includes: a battery pack; a power inverter coupled to said battery pack; a controller controlling said power inverter, said controller monitoring a state of charge (SOC) and a state of health (SOH) of said battery pack; and a program product for computing SOC associated to said controller.

These and other features and advantages of the invention will be more fully understood from the following description of certain specific embodiments of the invention taken together with the accompanying drawings.

DESCRIPTION OF THE PREFERRED EMBODIMENT

Figure 1:
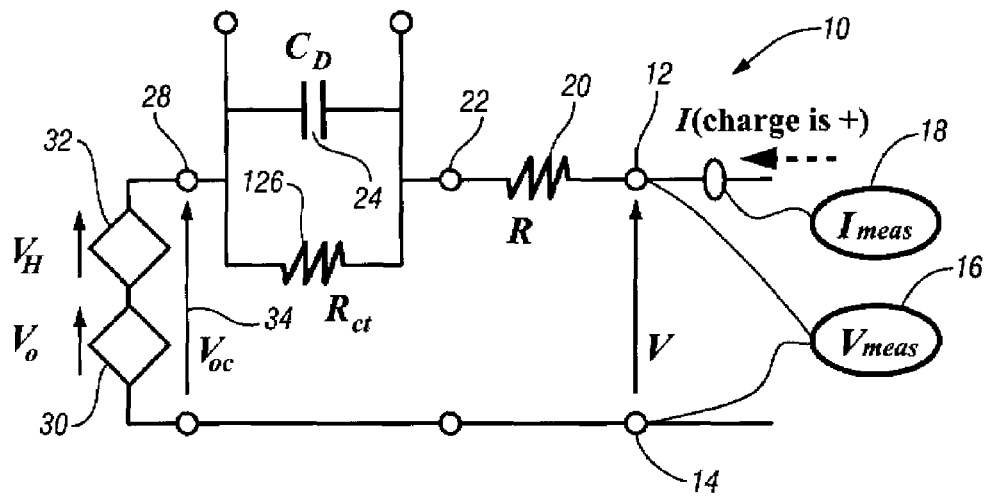
FIG. 1 is an equivalent circuit used to model a battery system.

Referring now to the drawings in detail, in FIG. 1 numeral 10 generally indicates an equivalent circuit of a battery module suitable for the instant invention. Equivalent circuit 10 has a first end 12 and a second end 14, with a voltage V existing there between. A voltage measuring means 16 such as a voltmeter can be disposed between the first end 12 and second end 14 for a reading of the measured voltage V. An electric current measuring device 18 is adapted to measure an electric current at first end 12. A series resistance R 20 is disposed between a third point 22 and first end 12. A capacitance $C_D$ 24, and a parallel resistance $R_{ct}$ 26 are disposed between third point 22 and a fourth point 28. A battery voltage source Vo 30 and a hyteresis voltage source $V_H$ 32, coupled together in series, are disposed between a fourth point 28 and second end 14. Between fourth point 28 and second end 14, an open circuit voltage $V_{oc}$ 34 is defined.

Figure 2:
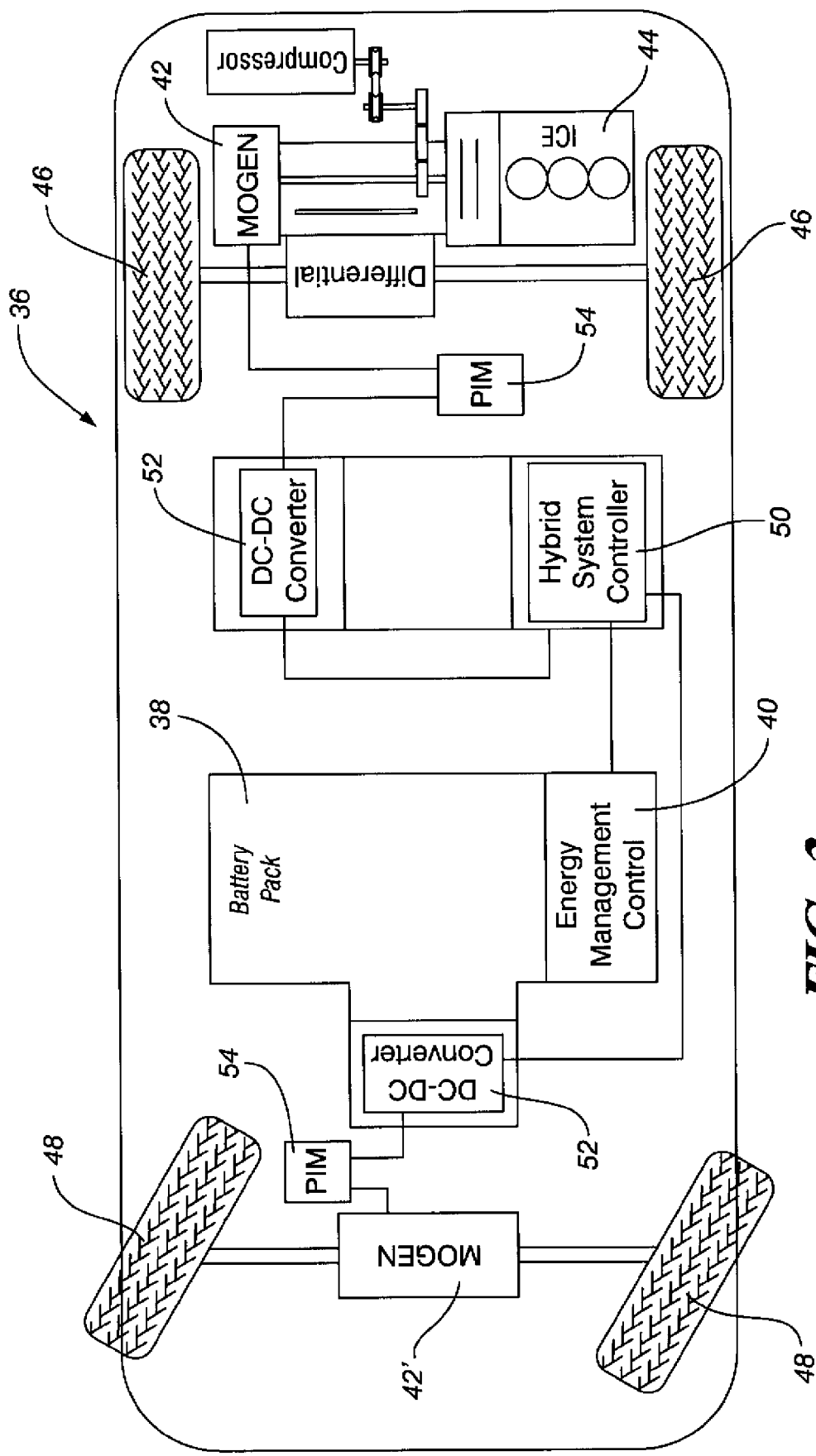
FIG. 2 is a diagrammatic view of a hybrid vehicle of the present invention.

FIG. 2 is a diagrammatic view of a hybrid vehicle 36 of the present invention. The hybrid vehicle 36 includes a battery pack 38 having a single battery module or a plurality of individual battery modules. In a first embodiment, the battery pack 38 comprises a plurality of NiMH batteries connected in series to produce a 336-Volt nominal bus, although any voltage is within the scope of the present invention. In a second embodiment, the battery pack 38 comprises a plurality of lead-acid batteries connected in series to produce a desired voltage. In alternate embodiments of the present invention, the battery pack 38 may comprise any known battery technology including but not limited to nickel/metal hydride, lithium-ion, and lithium polymer. An energy management controller (EMC) 40 monitors a set of parameters including but not limited to the current, voltage, state of charge (SOC), state of health (SOH), battery internal resistances (e.g., R 20, or $R_{ct}$ 26), battery internal reactances (e.g., $C_D$ 24), battery hysteresis voltage (e.g., $V_H$ 32), and power output of the battery pack 16.

A motor generator (MoGen) 42 is dynamically coupled to an internal combustion engine (ICE) 44 and functions as either a motor to propel the vehicle 36 or a generator to charge the battery pack 38, depending on the operating state of the vehicle 36 (i.e., braking, accelerating, or operating at a constant speed on a highway). The MoGen 42 is preferably an AC induction machine, but may comprise any known electrical motor/generator technology including but not limited to DC machines, synchronous machines, and switched reluctance machines. The MoGen 42 in this embodiment is located on the rear of the vehicle to drive the rear wheels 46. A similar MoGen 42' is located on the front of the vehicle 36 to drive the front wheels 48.

The MoGens 42, 42' are controlled by an electrical control system comprising a hybrid system controller 50, DC-DC converters 52 and power inverter modules 54. The EMC 40 communicates with the hybrid system controller 50 and power inverter modules 54 to provide voltage, current, and/or power output/input limits for the battery pack 38 based on a SOC measurement. In an alternate embodiment of the present invention, the EMC 40, hybrid system controller 50, DC-DC converters 52, and power inverter modules 54 may be configured as a unitary system. The EMC 40 and hybrid system controller 50 may comprise any type of control module or vehicle controller known in the art, and are equipped with nonvolatile memory (NVM), random access memory (RAM), discrete and analog input/output (I/O), a central processing unit, and/or communications interfaces for networking within an automotive communications network.

In generator mode, the MoGens 42, 42' generate electrical energy that is transferred to the battery pack 38 and the DC-DC converters 52 by the controller 50 and inverter modules 54. The controller 50 and inverter modules 54 determine the direction of current flow for the MoGens 42, 42', according to a vehicle 36 operating state. The DC-DC converters 52 provide and regulate a DC bus that is pulse-width-modulated by the inverter modules 54 to supply time varying current to the MoGens 42, 42'. In a regenerative state (such as during braking) or charging condition, current will flow from the MoGens 42, 42', via the inverter modules 54, to charge the battery pack 38 and provide current to the DC-DC converters 52. In a state where the MoGens 42, 42' are needed to provide propulsion, current will flow from the battery pack 38 of the MoGens 42, 42', via the DC-DC converters 52 and inverter modules 54, to power the MoGens 42, 42'.

In the preferred embodiment of the present invention, the SOC of the battery pack 38 is dynamically tracked to determine when to charge the battery pack 38. The EMC 40 and hybrid controller 50 of the present invention will control a battery pack's state of charge (SOC) usually between 20% to 80% so that an improved charge acceptance and efficiency in such junctures as during regenerative braking can be realized. However, controlling the battery pack 38 to any SOC percentage is within the scope of the present invention.

The methods executed by the EMC 40 to determine the SOC of the battery pack 38 include a current-based SOC method and measurement (ISOC), for example, Coulomb counting or Coulomb integration; a voltage-based SOC method and measurement (VSOC), and a rest SOC method and measurement (RSOC). A selection method then determines which SOC measurement is the most accurate, depending on the operation of the battery pack 38.

Model Formulation

To calculate the state of charge (SOC), the following equation is utilized:

$$SOC = w_{SOC}(SOC_C) + (1 - w_{SOC})(SOC_V) \qquad 1)$$

where $w_{SOC}$ is a weighting factor (which is described infra), $SOC_C$ is the state of charge as calculated by Coulomb integration (a current-based state of charge calculating means), and $SOC_V$ corresponds to a voltage-based state of charge, which will be described infra.

For $SOC_C$, the following equation defines the same:

$$SOC_C(t) = SOC(t - \Delta t) + \int_{t-\Delta t}^{t} \left[ 100 \frac{\eta_I I}{Ah_{nominal}} - S_D \right] \frac{dt}{3600} \qquad 2)$$

Note that positive currents represent charging of the battery. Time is represented by t, and electric current is represented by I; unless otherwise noted, discharge currents are taken as negative. $Ah_{nominal}$ represents a nominal capacity that corresponds to the ampere-hours of capacity of the battery, when discharged from 100% SOC to 0% SOC at low rates of discharge. For practical purposes, a current that discharges the nominal capacity in 10 hours will suffice; this quantity is expected to vary with temperature. $S_D$ is self-discharge rate and $\eta_I$ is current efficiency. Note that self-discharge rate and current efficiency are expected to vary with both temperature and SOC. In general, current efficiencies are expected to decrease with increasing SOCs, obtaining a value of zero at full charge. Further, positive values of $S_D$ denote the spontaneous discharge of active material. The factor 3600 has units of s/h, and the factor 100 is employed to keep a consistent percent basis.

As previously discussed, to extract a voltage-based $SOC_V$, a voltage-based model provides the starting point:

$$V = V_{oc} + IR - A \int_{\zeta=t}^{\zeta=0} I(\zeta) \exp[-B(t-\zeta)] d\zeta \qquad 3)$$

The first two terms on the right side give rise to an Ohmic description of the battery, as the battery voltage V is related to the open-circuit potential $V_{oc}$ 34 reduced by the Ohmic drop IR. The last term on the right side corresponds to a superposition integral, through which past currents influence the cell potential beyond the first-order effect of changing the average state of charge characterizing the cell thermodynamics and Ohmic drop. (Because of the exponential weighting function, the effect of early currents is less than those of recent currents. Note that $\zeta$ is the dummy variable of integration.) The equivalent circuit corresponding to the integral equation is circuit 10 shown in FIG. 1. Further, the hysteresis contribution $V_H$ 32 is discussed infra. The parameters A and B correspond to $A=1/C_D$ and $B=1/(R_{ct}C_D)=1/\tau$, where $\tau$ can be viewed as a time constant. Therefore, the A and B are functions of parameters $C_D$, and $R_{ct}$, $C_D$ respectively. It follows that A and B are variables that change; and by defining them as variables, it necessarily eliminates the calibration process that tries to fix a constant value for A and B.

Furthermore, open-circuit potential $V_{oc}$ 34 is a function of temperature, $SOC_V$, and a hysteresis function:

$$V_{oc} = V_o(T, SOC_V) + V_H \qquad 4)$$

A look-up table can be used to determine the $SOC_V$ once the value of $V_o$ 30 is obtained (i.e., values of $V_o$ 30 can be placed in a table such that $V_o$ 30 is a function of both temperature T and $SOC_V$; thus, knowing $V_o$ and T allows one to determine the $SOC_V$).

For the hysteresis contribution, we construct the following first-order differential equation to calculate a hysteresis voltage $V_H$:

$$\frac{\partial V_H}{\partial t} = \beta(\eta_I I - S_D)[V_{H,\max} - \text{sign}(I) V_H] \qquad 5)$$

This equation constructs a varying hysteresis voltage for a lead-acid battery. However, the equation can be a model of other types of batteries such as nickel/metal hydride (NiMH) and lithium-ion batteries as well. NiMH batteries are known to have the largest hysteresis voltage contribution of the aforementioned systems. The hysteresis voltage is formulated so that for prolonged charge currents, or short but very large charge currents, the hysteresis voltage tends to converge to the following value of about $V_H \rightarrow V_{H,\max} = 16.5$ mV/cell, or 0.297 V/pack (in one experiment, the pack consists of three battery modules, with six cells/module). The exact opposite holds for discharge currents, in which case the hysteresis voltage in the experiment tends to $-16.5$ mV/cell. Note also that if the current remains at zero for a long time, the hysteresis voltage tends to the charge into a decreasing condition through self-discharge. The parameters in this equation (including $V_{H,\max}$) can be temperature and SOC dependent.

Implementation Details

First, the Coulomb integration model is used to determine $SOC_C(t)$; in discretized form, we rewrite the current-integral equation 2 as:

$$SOC_C(t) = SOC_{t-\Delta t} + \left[\frac{100}{Ah_{nominal}} \left\{\frac{(\eta_I I)_{t-\Delta t} + (\eta_I I)_t}{2}\right\} - S_D\right] \frac{\Delta t}{3600} \qquad 6)$$

Because the nominal Ah and self-discharge rate are not expected to vary rapidly with time, their values can be evaluated at the previous time-step temperature. Note that the integration over a time interval begins at SOC, not $SOC_C$. The time difference between the present time and the last recorded time is given by $\Delta t$.

Referring now to voltage-based SOC, the superposition integral (Eq. 3) for the voltage is approximated as $$V_t = (V_{oc} + IR)_t + \left(\frac{I_{t-\Delta t} + I_t}{2}\right) A_d r \Delta t + \exp(-B\Delta t)(V - V_{oc} - IR)_{t-\Delta t} \qquad 7)$$

where the subscripts t and $t-\Delta t$ denote the times at which the quantities are to be evaluated. $A_d$ is the inverse of the capacitance on discharge, and r is the ratio of A for charge to that of discharge; i.e., $$r(T, SOC) = A_c/A_d = C_{D,discharge}/C_{D,charge} \qquad 8)$$

where during discharge, r=1. The voltage equation is a particularly simple recursion relation: only variables calculated at the present and previous time step are required to calculate the voltage at time t.

The hysteresis function, Eq. 5, can be approximated with backward integration:

$$(V_H)_t = (V_H)_{t-\Delta t} + \beta \Delta t \{(\eta_I I - S_D)[V_{H,\max} - \text{sign}(I) V_H]\}_{t-\Delta t} \qquad 9)$$

Upon combining Eqs. 7 and 9, one can approximate the battery voltage with the following:

$$V_t = V_o + (V_H)_{t-\Delta t} + \beta \Delta t \{(\eta_I I - S_D)[V_{H,\max} - \text{sign}(I) V_H]\}_{t-\Delta t} + \qquad 10)$$
$$I_t R + \left(\frac{I_{t-\Delta t} + I_t}{2}\right) A_d r \Delta t + E(V - V_0 - IR)_{t-\Delta t}$$

where $E = \exp(-\Delta t/\tau)$.

Generalized Weighted Recursive Least Squares (WRLS) Formulation

A symbolic manipulator is used to keep the analysis as efficient as possible, commensurate with the application of a method used in an automotive embedded controller context. The symbolic manipulator provides explicit analytic solutions for the regressed parameters. Related to our attempts at efficiency, expressions for the regressed parameters all contain the determinant of the relevant square matrix, a single-valued function, which provides a convenient means to assess the suitability of the collected data for parameter regression. In an experimental application, the determinant must be greater than a set calibration value for the parameter regression to be implemented.

The instantaneous error $\epsilon$ in the desired voltage response is defined as $$\epsilon(t) = [y - (m_1 x_1 + m_2 x_2 + \ldots + m_L x_L + b)]$$

where y represents the experimentally obtained voltage at time t (i.e., $y = V_t^{measured}$), and the values $x_1, x_2, \ldots, x_L$ represent the measured quantities at time t on which the parameters $m_1, m_2, \ldots, m_L$ multiply, respectively, to complete the linear model once the parameter b is included. It should be noted that L can be any finite natural number, positive integer, the value of which is subject to practical consideration such as time lag restrictions, or processor speed.

A weight factor w is introduced to better, or more closely, model the true condition of a battery system. For weighted least squares analysis (weight factor w), we seek to minimize the error term $$\varepsilon = \sum_{j=1}^{j=N} w_j[y_j - (b + m_1 x_{1,j} + m_2 x_{2,j} + \ldots + m_{L,j} x_{L,j})]^2$$

$$= \sum_{j=1}^{j=N} w_j \left[ y_j - b - \sum_{l=1}^{l=L} m_l x_{l,j} \right]^2$$

where the subscript j denotes the time step. By setting the partial derivatives of $\epsilon$ with respect to each of the parameters $m_1, m_2, \ldots, m_L$ and b to zero, we obtain the following L+1 equations:

$$b = \frac{1}{\sum_{j=1}^{j=N} w_j} \left( \sum_{j=1}^{j=N} w_j y_j - m_1 \sum_{j=1}^{j=N} w_j x_{1,j} - m_2 \sum_{j=1}^{j=N} w_j x_{2,j} - \ldots - m_L \sum_{j=1}^{j=N} w_j x_{L,j} \right),$$

$$0 = \sum_{j=1}^{j=N} w_j y_j x_{1,j} - b \sum_{j=1}^{j=N} w_j x_{1,j} - m_1 \sum_{j=1}^{j=N} w_j x_{1,j} x_{1,j} - m_2 \sum_{j=1}^{j=N} w_j x_{2,j} x_{1,j} - \ldots - m_L \sum_{j=1}^{j=N} w_j x_{L,j} x_{1,j},$$

$$0 = \sum_{j=1}^{j=N} w_j y_j x_{2,j} - b \sum_{j=1}^{j=N} w_j x_{2,j} - m_1 \sum_{j=1}^{j=N} w_j x_{1,j} x_{2,j} - m_2 \sum_{j=1}^{j=N} w_j x_{2,j} x_{2,j} - \ldots - m_L \sum_{j=1}^{j=N} w_j x_{L,j} x_{2,j},$$

$$\vdots$$

$$0 = \sum_{j=1}^{j=N} w_j y_j x_{L,j} - b \sum_{j=1}^{j=N} w_j x_{L,j} - m_1 \sum_{j=1}^{j=N} w_j x_{1,j} x_{L,j} - m_2 \sum_{j=1}^{j=N} w_j x_{2,j} x_{L,j} - \ldots - m_L \sum_{j=1}^{j=N} w_j x_{L,j} x_{L,j}$$

The above L+1 equations can be more compactly expressed as $$0 = \sum_{j=1}^{j=N} w_j y_j x_{\ell,j} - b \sum_{j=1}^{j=N} w_j x_{\ell,j} - \sum_{l=1}^{l=L} m_l \sum_{j=1}^{j=N} w_j x_{l,j} x_{\ell,j} \quad (L \text{ equations: } \ell = 1, L)$$

The reasons for weighted data sets differently include the following. First, some observations may be subject to greater disturbance. A working definition of a disturbance refers to a phenomenon not accounted for in the system model. For example, the onset of secondary reactions during battery charging (hydrogen and oxygen evolution) may lead one to discount the charge observations relative to those of discharge, as the impact of the secondary reactions is not accounted for explicitly in the model equations. Second, some observations may be recognized as having less relevance to the scope of the model equations. For example, newer observations are generally more important than older observations in determining the state of the system and therefore should usually be given a larger weight factor relative to older observations. For these two reasons, at least, we shall find it convenient to decompose the weight factor into a time-weighting factor $\lambda$ and the factor $\zeta$; the latter will be used to weight discharge events over those of charge, but $\zeta$ can be viewed as a weight-factor contribution that can be changed arbitrarily. Hence, $$w_j = \gamma_j \lambda^{N-j} \begin{cases} \gamma_j = 1, \text{ charge} \\ \gamma_j > 1, \text{ discharge} \end{cases} \quad (11)$$

It can be shown that the use of $\lambda^{N-j}$ yields an exponential decay in the influence of past data points on the determination of the current value of $m_l$ and b:

$$\lambda^{N-j} = e^{\ln \lambda^{N-j}} = e^{(N-j)\ln \lambda} \approx e^{-(N-j)(1-\lambda)} \text{ for } \lambda \to 1 \quad (12)$$

Thus, $\Delta t/(1-\delta)$ reflects the time constant over which past points impact the regression analysis. For example, $\Delta t$ can be kept near one second, $\delta=0.99$, and $(1 \text{ s})/(1-0.99)=100 \text{ s}$. Hence, a data point taken 100 s prior to the current point has less than 40% of the impact on the regression analysis relative to that of the current point. A data point taken 500 s prior to the current point has less than 1% of the impact on the regression relative to that of the current point. The above is known as exponential forgetting.

The above-listed summations are made recursive with the following definitions:

$$s_w |_N = \gamma_N + \lambda(s_w |_{N-1}), \quad (13)$$

$$s_u |_N = \gamma_N u_N + \lambda(s_u |_{N-1}), \text{ and}$$

$$s_{u,v} |_N = \gamma_N u_N v_N + \lambda(s_{u,v} |_{N-1}).$$

In these sums, u and v refer to y or $x_1$; e.g., $$s_{x_1} = \sum_{j=1}^{j=N} w_j x_{1,j},$$

$$s_{x_1,x_2} = \sum_{j=1}^{j=N} w_j x_{1,j} x_{2,j}, \text{ and } s_{y,x_1} = \sum_{j=1}^{j=N} w_j y x_1,$$

Note that $s_{u,v} = s_{v,u}$ initially define the following:

$$s_w |_1 = \gamma_1, \quad (14)$$

$$s_u |_1 = \gamma_1 u_1, \text{ and}$$

$$s_{u,v} |_1 = \gamma_1 u_1 v_1$$

The following covariance expressions are used:

$$V_{uv}|_N = \left(s_{u,v}|_N - \frac{s_u|_N s_v|_N}{s_w|_N}\right)\frac{1}{s_w|_N} \quad 15)$$

(where $V_{uv}=V_{vu}$). We can now formulate the following (symmetric) matrix system of equations:

$$m_1 V_{1,1} + m_2 V_{1,2} + m_3 V_{1,3} + \ldots + m_L V_{1,L} = V_{y,1},$$
$$m_1 V_{1,2} + m_2 V_{2,2} + m_3 V_{2,3} + \ldots + m_L V_{2,L} = V_{y,2},$$
$$m_1 V_{1,3} + m_2 V_{2,3} + m_3 V_{3,3} + \ldots + m_L V_{3,L} = V_{y,3},$$
$$\vdots$$
$$m_1 V_{1,L} + m_2 V_{2,L} + m_3 V_{3,L} + \ldots + m_L V_{L,L} = V_{y,L},$$

or $$\sum_{l=1}^{l=L} m_l V_{\ell,l} = V_{y,\ell} \quad (L \text{ equations}; \ell = 1, L; V_{\ell,l} = V_{l,\ell})$$

This symmetric system can be expressed as $$Xm = Y \quad 16)$$
where
$$Y = \begin{bmatrix} V_{y,1} \\ V_{y,2} \\ V_{y,3} \\ \vdots \\ V_{y,L} \end{bmatrix}, \quad 17)$$

$$m = \begin{bmatrix} m_1 \\ m_2 \\ m_3 \\ \vdots \\ m_L \end{bmatrix}, \text{ and } X = \begin{bmatrix} V_{1,1} & V_{1,2} & V_{1,3} & \cdots & V_{1,L} \\ V_{1,2} & V_{2,2} & V_{2,3} & \cdots & V_{2,L} \\ V_{1,3} & V_{2,3} & V_{3,3} & \cdots & V_{3,L} \\ \vdots & \vdots & \vdots & \ddots & \vdots \\ V_{1,L} & V_{2,L} & V_{3,L} & \cdots & V_{L,L} \end{bmatrix}$$

Upon solution of the matrix system for the parameters $m_l$, the parameter b can be extracted for the following (recursive) expression:

$$b = \frac{1}{[\gamma_N + \lambda(s_w|_{N-1})]} \left\{ \begin{array}{l} \gamma_N y_N + \lambda(s_y|_{N-1}) - \\ \sum_{l=1}^{l=L} m_l[\gamma_N x_{l,N} + \lambda(s_{x_l}|_{N-1})] \end{array} \right\}. \quad 18)$$

The benefit of removing b from the matrix system Xm=Y is related to the fact that b is not a vector or tensor and therefore need not be included in operations associated with solving the matrix system. As an alternative, albeit it would be add complexity, one could place b in the m vector, with the corresponding changes to the entries in X that multiply onto b.

In summary, we have provided the equations that will be used to implement the WRLS method. It is noted that many other formulations exist; the current presentation is chosen because it facilitates the extraction of explicit analytic expressions for the parameters $m_l$ and b with a minimum of matrix algebra. This may significantly reduce system complexity concomitant to a battery pack control systems such as Hybrid System controller 50 or EMC 40. For the expositional approach taken here, we require the solution to $$m = X^{-1}Y \quad 19)$$

This expression is equivalent to $$\tilde{m} = (\tilde{x}^T w \tilde{x})^{-1} \tilde{x}^T w y \quad 20)$$

Here, $\tilde{x}$ denotes the coefficient matrix comprising the $x_j$ entries, the y vector contains the $y_j$ entries, and w comprises the $w_j$ weighting elements (including the forgetting factor); as formulated in this work, w is a diagonal matrix with entries $w_1$, $w_2$, $w_3$, . . . , $w_N$. The parameter vector is given by $\tilde{m}$. The tilde over the vector $\tilde{m}$ and matrix $\tilde{x}$ is used to indicate that the parameter b is now included in the vector $\tilde{m}$, with corresponding changes to elements in $\tilde{x}$ that multiply onto b.

With regard to the solution:

$$m = X^{1}Y;$$

one conventional approach is to have mathematically equivalent formulations that are constructed with intermediate calculations involving covariance and gain matrixes, both of which contain useful analytical information therein. The instant application does not utilize such formulations, as they are less direct with respect to the use of symbolic manipulators.

Because of the recursive nature of the method, it is important to seed the initial values for the parameters $m_l$; this can be done by using previously measured values, under independent test conditions (e.g., laboratory analysis) to provide $m_l|_{t=0}$.

For a two-parameter system, $y = m_1 x_1 + b$, and $$m_1 = \frac{V_{y,1}}{V_{1,1}}$$

It is noted that using a matrix approach standardized a method suitable for computer program product implementation. Even though the above two parameter case can be solved using other means, a standardized approach using matrix is preferred because higher order matrices can be processed using the same method.

For three-parameter models, $y = m_1 x_1 + m_2 x_2 + b$, and $$\text{Det} = V_{1,1} V_{2,2} - V_{1,2}^2,$$
$$m_1 = \frac{1}{\text{Det}}[V_{y,1} V_{2,2} - V_{y,2} V_{1,2}], \text{ and}$$
$$m_2 = \frac{1}{\text{Det}}[V_{y,2} V_{1,1} - V_{y,1} V_{1,2}]$$

where Det represents the determinant of X.

For four-parameter models, $y = m_1 x_1 + m_2 x_2 + m_3 x_3 + b$, and $$\text{Det} = V_{1,3}^2 V_{2,2} - 2V_{1,2} V_{1,3} V_{2,3} + V_{1,1} V_{2,3}^2 + V_{1,2}^2 V_{3,3} - V_{1,1} V_{2,2} V_{3,3},$$
$$m_1 = \frac{1}{\text{Det}} \begin{bmatrix} V_{2,3}^2 V_{y,1} - V_{2,2} V_{3,3} V_{y,1} + V_{1,2} V_{3,3} V_{y,2} + \\ V_{1,3} V_{2,2} V_{y,3} - V_{2,3}(V_{1,3} V_{y,2} + V_{1,2} V_{y,3}) \end{bmatrix},$$

-continued $$m_2 = \frac{1}{\text{Det}} \begin{bmatrix} V_{1,3}^2 V_{y,2} - V_{1,1} V_{3,3} V_{y,2} + V_{1,2} V_{3,3} V_{y,1} + \\ V_{1,1} V_{2,3} V_{y,3} - V_{1,3} (V_{2,3} V_{y,1} + V_{1,2} V_{y,3}) \end{bmatrix}, \text{ and}$$

$$m_3 = \frac{1}{\text{Det}} \begin{bmatrix} V_{1,3}^2 V_{2,2} V_{y,1} - V_{1,2} V_{2,3} V_{y,1} - V_{1,2} V_{1,3} V_{y,2} + \\ V_{1,1} V_{2,3} V_{y,2} + V_{1,2}^2 V_{y,3} - V_{1,1} V_{2,2} V_{y,3} \end{bmatrix}$$

Statistical Tests for the Regression Analysis

A plurality of tests is performed to determine what actions to perform subsequently. The first critical test pertains to the value of the determinant. Specifically, $$\text{Det\_test} = \begin{cases} 0 \text{ if } \text{abs}(Det) < \text{Det\_cal} \\ 1 \text{ if } \text{abs}(Det) \geq \text{Det\_cal} \end{cases} \quad 21)$$

Thus, if the determinant is too small to ensure numerically accuracy in the evaluation of the matrix equations, the value of Det_test is set to zero, and the analytic expressions used to extract the parameter values $m_l$ are not to be employed.

The next test concerns the nature of the variation in the current excitation source. For our purposes, we define skewness as $$\text{Skewness} = \left| \frac{1}{N\sigma^3} \sum_{j=1}^{j=N} (x_j - \bar{x})^3 \right|$$

where $\bar{x}$ is the average of the x-values and $\sigma^2$ is a variance. Under one test, we restrict the skewness test to the actual current-time (excitation source) values I(t) and do not incorporate the charge-discharge weighting. Following the same logic used previously, recursive relations are employed, with the subscript s added to indicate quantities associated with the skewness calculation:

$$S_{w,s}|_N = \sum_{j=1}^{N} \lambda^{N-j} = 1 + \lambda \sum_{j=1}^{N-1} j\lambda^{N-1-j} = 1 + \lambda(s_{w,s}|_{N-1}) \quad 22)$$

$$S_{I,s}|_N = \frac{1}{\sum_{j=1}^{N} \lambda^{N-j}} \sum_{j=1}^{N} \lambda^{N-j} I_j = \frac{I_N + \lambda(s_{I,s}|_{N-1})(s_{w,s}|_{N-1})}{(s_{w,s}|_N)}$$

$$S_{II,s}|_N = \frac{1}{\sum_{j=1}^{N} \lambda^{N-j}} \sum_{j=1}^{N} \lambda^{N-j} I_j^2 = \frac{I_N^2 + \lambda(s_{II,s}|_{N-1})(s_{w,s}|_{N-1})}{(s_{w,s}|_N)}$$

skewness $|_N =$ 23)

$$\begin{cases} \text{skew\_cal if Det\_test} = 0 \\ \left| \frac{(I_N s_{I,s}|_N)^3}{[s_{II,s}|_N - (s_{I,s}|_N)^2]^{3/2}} \right| \frac{1}{N} + (\text{skewness}|_{N-1})\left(1 - \frac{1}{N}\right) \text{ if Det\_test} = 1 \end{cases}$$

The value of skew_cal represents a calibration, which has been set to 10 in an experiment and is also based on experience with the method. To start the recursive calculations for skewness, the following conditions are used.

$$s_{w,s}|_1 = 1 \quad 24)$$
$$s_{I,s}|_1 = I_1$$
$$s_{II,s}|_1 = I_1^2$$

The skewness test is important for the first time step; in particular, Det_test$|_{t=0}=0$, thus skewness$|_{t=0}$ will be set to skew_cal. Analogous to Det_test, define $$\text{skew\_test} = \begin{cases} 0 \text{ if } skewness \geq \text{skew\_cal}, \\ 1 \text{ if } skewness < \text{skew\_cal}. \end{cases} \quad 25)$$

As with Det_test, the regression analysis is not employed if the skew test is not passed. The final result for our statistical tests corresponds to if Det_test or skew_test = 0, 26)

$$\text{then} \begin{cases} (m_l)_t = (m_l)_{t-\Delta t}, \text{ and} \\ b_t = y_t - \sum_{l=1}^{l=L} (m_l)_{t-\Delta t} (x_l)_t \end{cases}$$

Note that this approach allows one to calculate the parameter b under all conditions, which implies that the open-circuit voltage can always be extracted.

Weighting Factor for Current-Based Versus Voltage-Based SOC

An important topic to be clarified is the weight factor $w_{SOC}$; in particular, the influence of the time-step size needs to be addressed in the calculation of this factor. For very small time-steps, the weighting factor should be altered so that time-dependent quantities are not lost from the calculation and instead are allowed to evolve in accordance with their particular time constants. We begin with $$w_{SOC} = 1 - \alpha(\Delta t) \quad 27)$$

The weighting factor is to be bounded between 0 and 1. $\alpha$ is a time increment dependent quantity. The quantity $\alpha$ is obtained as follows.

In order to make the method adaptive with a shorter duration to pseudo-steady state, a provision is made to reduce the weight factor w upon start up of the method. In addition, the voltage-based contribution is further enforced when the SOC falls below a calibrated value (e.g., 20% is suggested). With these thoughts in mind, the procedure outlined in Table 1 is used to calculate $w_{SOC}$.

TABLE 1

Calculation of weight factor $W_{SOC}$.

$w_{SOC} = \min\{\underline{1}, \max[\underline{0.5}, 1 - \alpha(\Delta t)]\}$.
$\alpha$ is determined using the following logic:
$\alpha = \min\{\alpha_{init}, \max(\alpha_f, \tilde{\alpha})\}$, where for $t < t_{init}$ and SOC $\geq \underline{20\%}$, $\tilde{\alpha} = \alpha_{init} + (\alpha_f - \alpha_{init})\frac{t}{t_{init}}$, unless $V_o$ and T are recorded at start up; then invert $V_o$ to extract SOC$|_{t=0}$ and set $\tilde{\alpha} = \alpha_f$;
for $t \geq t_{init}$ and SOC $\geq \underline{20\%}$, $\tilde{\alpha} = \alpha_f$, unless TABLE 1-continued Calculation of weight factor $W_{SOC}$.

if $abs(SOC_t - SOC_{t-\Delta t}) > \underline{1.2}\Delta t/Ah_{nominal}$, then for
$t < t_{init} + t_{at\ abs(SOC_t-SOC_{t-\Delta t}) > \underline{1.2}\Delta t/Ah_{nominal}}$, $$\tilde{\alpha} = \alpha_{init} + (\alpha_f - \alpha_{init}) \frac{t - t_{at\ abs(SOC_t-SOC_{t-\Delta t}) > \underline{1.2}\Delta t/Ah_{nominal}}}{t_{init}};$$

for SOC < $\underline{20\%}$ and all times, $\tilde{\alpha} = \alpha_{init}$.

Note that underlined values correspond to suggested calibrations. The suggested value of 1.2 corresponds to (~5000 A)/(3600 s/hr); thus, Δt is to be provided in units of seconds for the above calibrations. The implication associated with 5000 A is that if the change in SOC over a time step corresponds to 5000 A of current or larger, then there has likely been some sort of error in the system, as currents this large should not be observed. In such cases, the routine is set to a more adaptive state, as the voltage-based portion of the method is increased in influence. For example, if an electromagnetic disturbance were to corrupt the current-sensor reading and cause a jump in the calculated SOC, then the routine would be allowed adapt back to the actual SOC. (In such cases, it would also be prudent to set a fault for diagnostic purposes.) Other suggested parameter values are $\alpha_{init}$ 0.001 s$^{-1}$ $\alpha_f$ 0.001 s$^{-1}$ $t_{init}$ 500 s Implicit in the implementation of the voltage-based SOC is that the open-circuit voltage is used to initialize the method. That is, before power is drawn from or put into the battery upon start of application, an open-circuit voltage reading is used to extract the SOC. In the unusual event that such a reading is not available, the SOC stored in memory (e.g., non-volatile memory such as electronically erasable programmable read only memory, or EEPROM) after key-off from the prior use of the battery system can be used to initialize the method. If neither value is available, an initial value of SOC=50% may be used as a sufficient approximation, as the method will adapt quickly to the pseudo-steady behavior of the system.

Power Capability Calculation

The max discharge power can be expressed as:

$$P_{max,discharge} = IV = IV_{min}$$

That is, when the battery voltage obtains its lowest acceptable value, the max discharge power results. First, consider an Ohmic battery, wherein the superposition integral (low frequency impedance) can be ignored. For the Ohmic battery, $V = V_{oc} + IR$, and $$P_{max,discharge} = IV_{min} = \frac{(V_{min} - V_{oc})}{R} V_{min}.$$

Similarly, for the max charge power for the Ohmic battery is given by $$P_{max,charge} = IV_{max} = \frac{(V_{max} - V_{oc})}{R} V_{max}$$

For the maximum Ohmic resistance, obtained over a prolonged period, R is replaced by $R+R_{ct}$, where $R_{ct}$ reflects difference for charge and discharge.

Further, the Ohmic battery does not address transient effects such as these correlated by the superposition integral. To improve the estimate, for times that are greater than ~ 0.1/B, we include the superposition integral and calculate the maximum charge and discharge powers available for the time interval Δt:

$$I|_t = -\frac{(V_{oc} - V)_t + (AI_{t-\Delta t}\Delta t/2) + \exp(-B\Delta t)[V - (V_{oc} + IR)]_{t-\Delta t}}{R + (A\Delta t/2)},$$

$$P_{max,discharge}(\Delta t) = IV_{min}$$

$$= \left[ -\frac{(V_{oc} - V_{min})_t + (A_d I_{t-\Delta t}\Delta t/2) + \exp(-B\Delta t)[V - (V_{oc} + IR)]_{t-\Delta t}}{R + (A_d I_{t-\Delta t}\Delta t/2)} \right] V_{min},$$

and $$P_{max,charge}(\Delta t) = IV_{max}$$

$$= \left[ -\frac{(V_{oc} - V_{max})_t + (A_c I_{t-\Delta t}\Delta t/2) + \exp(-B\Delta t)[V - (V_{oc} + IR)]_{t-\Delta t}}{R + (A_c I_{t-\Delta t}\Delta t/2)} \right] V_{max}.$$

Note that the value of A differs for the charge and discharge power calculations. To implement these equations, the respective powers are calculated immediately after the method has been employed to finish the SOC determination at time t. In this case, quantities calculated or measured at time t are then stored in the variables listed in the respective power expressions at time t–Δt. Then one must state the duration corresponding to the desired estimate for power. Sufficiently accurate results can of obtained by not update $V_{oc}$ unless Δt were to exceed tens of seconds. One could then use Coulomb counting on the projected current to estimate a new state of charge and update $V_{oc}$. For example, if we want to know the power estimates 3 seconds from "now", then the current measured and extracted values are placed in the t–Δt quantities, t and Δt are set to 3 s, and the right sides of the above equations yield the desired power estimates. Numerical inaccuracies can give rise to errors in the numerical expressions for power capability, particularly for larger values of Δt. Thus, it is prudent to bound the power capabilities as follows:

$$P_{max,discharge} = \min\left\{ \frac{(V_{min} - V_{oc})}{R + R_{ct}} V_{min}, \max\left[ \frac{(V_{min} - V_{oc})}{R} V_{min}, P_{max,discharge}(\Delta t) \right] \right\} \quad (28)$$

and $$P_{max,charge} = \min\left\{ \frac{(V_{max} - V_{oc})}{R} V_{max}, \max\left[ \frac{(V_{max} - V_{oc})}{R + R_{ct}}, P_{max,charge}(\Delta t) \right] \right\}.$$

A Generalized Procedure and an Application for a Five-Parameter Model

Figure 3:
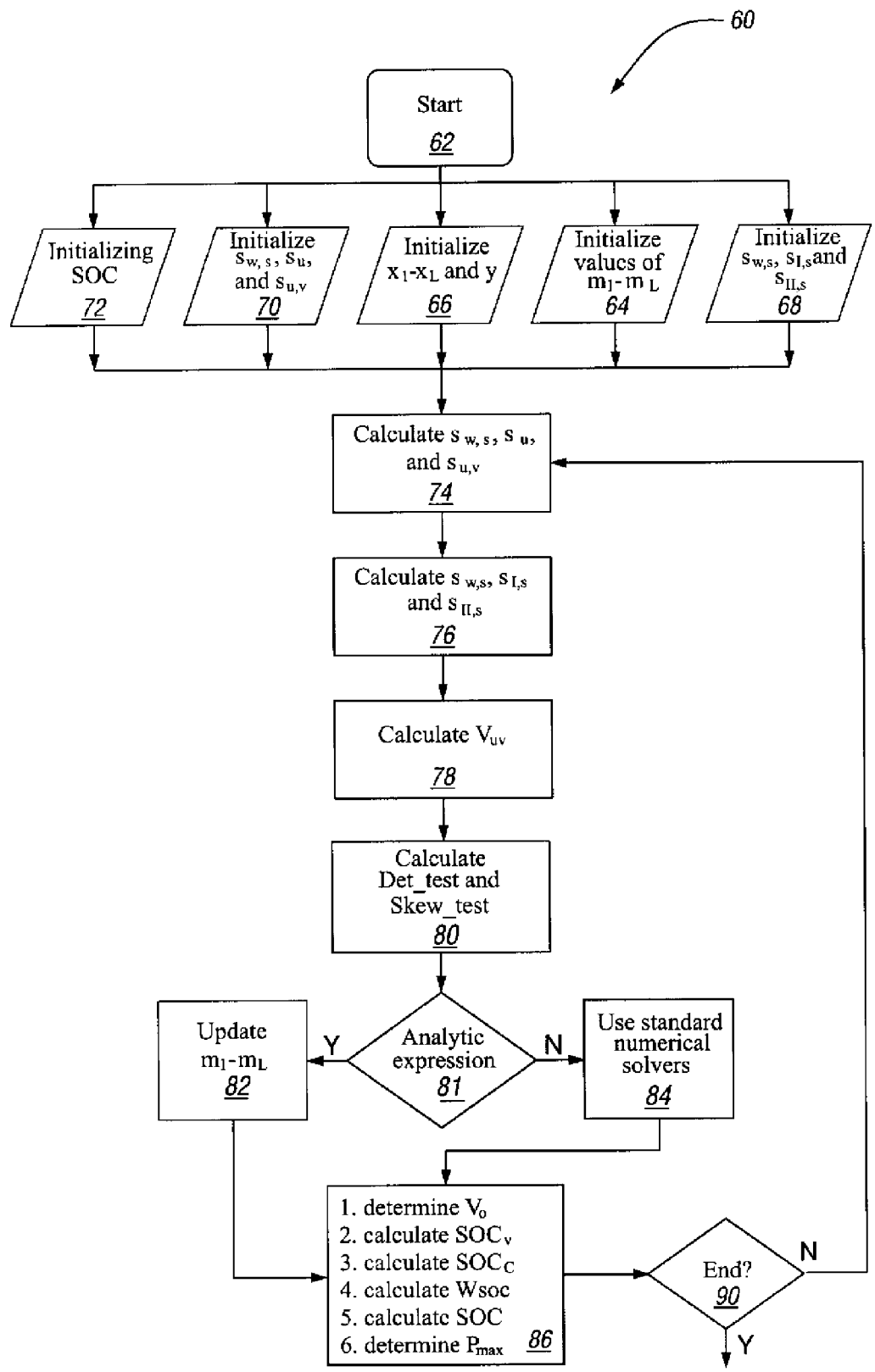
FIG. 3 is a flowchart of the present invention.

Referring to FIG. 3, a generalized application of a method of the invention is as follows. Numeral 60 generally denotes a flowchart depicting the generalized application. In step 62, the process starts. A plurality of initialization processes are performed. Parameters $m_1$, $m_2$, $m_3$, . . . , $m_L$ with stored values (obtained from prior analysis of the battery system) are initialized at step 64. Coefficients $x_1$, $x_2$, $x_3$, . . . , $x_L$, and y (based on the initial values for the current and battery voltage) are initialized at step 66. A first set of intermediate functions $s_{w,s}$, $s_{I,s}$, and $s_{II,s}$ (Eq. 24) is initialized at step 68. A second set of intermediate functions $s_{w,s}$, $s_u$, and $s_{u,v}$ (Eq. 14) is initialized at step 70. A SOC (per Table 1) is initialized at step 72. Equations 16 and 17 define the parameters $m_1$, $m_2$, $m_3$, . . . , $m_L$ and the variables $x_1$, $x_2$, $x_3$, . . . , $x_L$, and y for the 1, 2, 3, 4, and 5 parameter models described in this report. (For example, for the two parameter model $x_1$ and b apply, and the model voltage expression corresponds to $m_1 x_1 + b$; for the three parameter model, $x_1$, $x_2$, and b apply, etc.) Note that those terms that are not parameters in Eq. 10 are to be subtracted from both sides of the equation, and the remainder on the left side becomes the regression voltage. Thus, for the two parameter model, the regression voltage is $$y|_{Two\text{-}parameter\ model} = V^{to\ be\ used\ in\ regression} = V^{measured}|_t - (V_H)_{t-\Delta t} - (m_2 x_2 + m_3 x_3 + m_4 x_4)$$

wherein the parameters $m_2$, $m_3$, and $m_4$ are predetermined functions of temperature and SOC, and the values $x_2$, $x_3$, $x_4$, and y are updated at each time step consistent with the value of the current, voltage, temperature, and SOC.

For execution after the first time step, calculate $s_w$, $s_u$, and $s_{u,v}$ values (Eq. 13) at step 74; $s_{w,s}$, $s_{I,s}$, and $s_{II,s}$ (Eq. 22) at step 76; and $V_{uv}$ values (Eq. 15) at step 78. Calculate Det_test and Skew_test using Eqs. 21 and 25, respectively at step 80. At step 81, a determination is made with regard to whether a practical analytical expression is available. If available, consistent with Eq. 26, update parameters $m_1$, $m_2$, $m_3$, . . . , $m_L$ using analytic expressions provided in the text at step 82. If practical analytic expressions are not available, then standard numerical solvers can be employed for the linear systems described in Eq. 19, at step 84. Note that the value of b is extracted per Eq. 26 if Det_test=0 or Skew_test=0; otherwise, Eq. 18 is employed. At step 86, a plurality of determinations and calculations are performed. They include determining $V_o$, then inverting the expression for $V_o$ to extract $SOC_V$ (Eq. 4). Calculate $w_{SOC}$ using Eq. 27. Calculate $SOC_C$ from Eq. 6. Calculate SOC from Eq. 1. Determine the max charge and discharge power capability from Eq. 28. It is likely that the Ohmic-only power capabilities (of interest for very short and very long times) will also be of interest for vehicle control. At step 90, a determination is made as to whether an end occurs. If no, return to step 74 above unless the end of the battery system application is indicated (e.g., key off), in which case variable values such as SOC are to be stored in non-volatile memory (e.g., EEPROM).

For a five-parameter model, the voltage to be used in the regression analysis, $(V|_t$ from Eq. 10), corresponds to the measured voltage. Thus the following definitions are employed:

$$y = V^{to\ be\ used\ in\ regression} = V^{measured}|_t - (V_H)_{t-\Delta t} \qquad 29)$$
$$x_1 = I_t \text{ (A measured value)}$$
$$x_2 = (V^{measured} - V_{oc} - IR)_{t-\Delta t}$$
$$x_3 = \left(\frac{I_{t-\Delta t} + I_t}{2}\right)[r_{evaluated\ at\ average\ current\ value,\ (I_t + I_{t-\Delta t})/2}]\Delta t$$
$$x_4 = \Delta t\{(\eta_I I - S_D)[V_{H,max} - \text{sign}(I)V_H]\}_{t-\Delta t}$$

$$\left.\begin{array}{l} m_1 = R|_t \\ m_2 = \exp(-B\Delta t) = e^{-\Delta t/\tau} = E|_t \\ m_3 = A_d|_t \\ m_4 = \beta|_t \\ b = V_{oc}|_t \end{array}\right\} 5\text{ parameters to be regressed}$$

Note that we have used the measured voltage at $t-)t$ to calculate $x_2$, instead of the model voltage, $$V^{model}_{t-\Delta t} = (m_1 x_1 + m_2 x_2 + m_3 x_3 + m_4 x_4 + b)_{t-\Delta t}$$

It is noted that either approach can be used; it is found that convergence is accelerated, without prohibitive loss in stability, if the measured voltage is used instead of the modeled voltage for the previous time step. With these expressions, we can represent the difference between the measure voltage and the regressed (or modeled) voltage as $$\text{error}(t) = [y - (m_1 x_1 + m_2 x_2 + m_3 x_3 + m_4 x_4 + b)]_t$$

As noted previously, prior experimental analyses can be used to initialize the $m_l$ parameters for initial guesses. The measured values for current can be used to determine $x_1(0)$ and $x_3(0)$, while $x_2(0)$ and $x_4(0)$ can be set to zero.

To obtain the voltage-based SOC, the value of $V_o|_t(T, SOC) = b_t$ is inverted. The specific expressions needed to complete the recursive least squares analysis for the five-parameter model are provided in the Appendix. The governing matrix equation is given by $$X = \begin{bmatrix} V_{1,1} & V_{1,2} & V_{1,3} & V_{1,4} \\ V_{1,2} & V_{2,2} & V_{2,3} & V_{2,4} \\ V_{1,3} & V_{2,3} & V_{3,3} & V_{3,4} \\ V_{1,4} & V_{2,4} & V_{3,4} & V_{4,4} \end{bmatrix}, m = \begin{bmatrix} m_1 \\ m_2 \\ m_3 \\ m_4 \end{bmatrix}, \text{ and } Y = \begin{bmatrix} V_{y,1} \\ V_{y,2} \\ V_{y,3} \\ V_{y,4} \end{bmatrix}$$

The variances $V_{u,v}$ require the recursive evaluations of $s_w$, $s_{x_1}$, $s_{x_2}$, $s_{x_3}$, $s_{x_4}$, $s_y$, $s_{x_1 x_1}$, $s_{x_1 x_2}$, $s_{x_1 x_3}$, $s_{x_1 x_4}$, $s_{x_1 y}$, $s_{x_2 x_2}$, $s_{x_2 x_3}$, $s_{x_2 x_4}$, $s_{x_2 y}$, $s_{x_3 x_3}$, $s_{x_3 x_4}$, $s_{x_3 y}$, $s_{x_4 x_4}$, and $s_{x_4 y}$ (Eq. 14). These quantities are then used to construct the covariances of the matrix X using Eq. 15.

Discussion of Experimental Results

Figure 4:
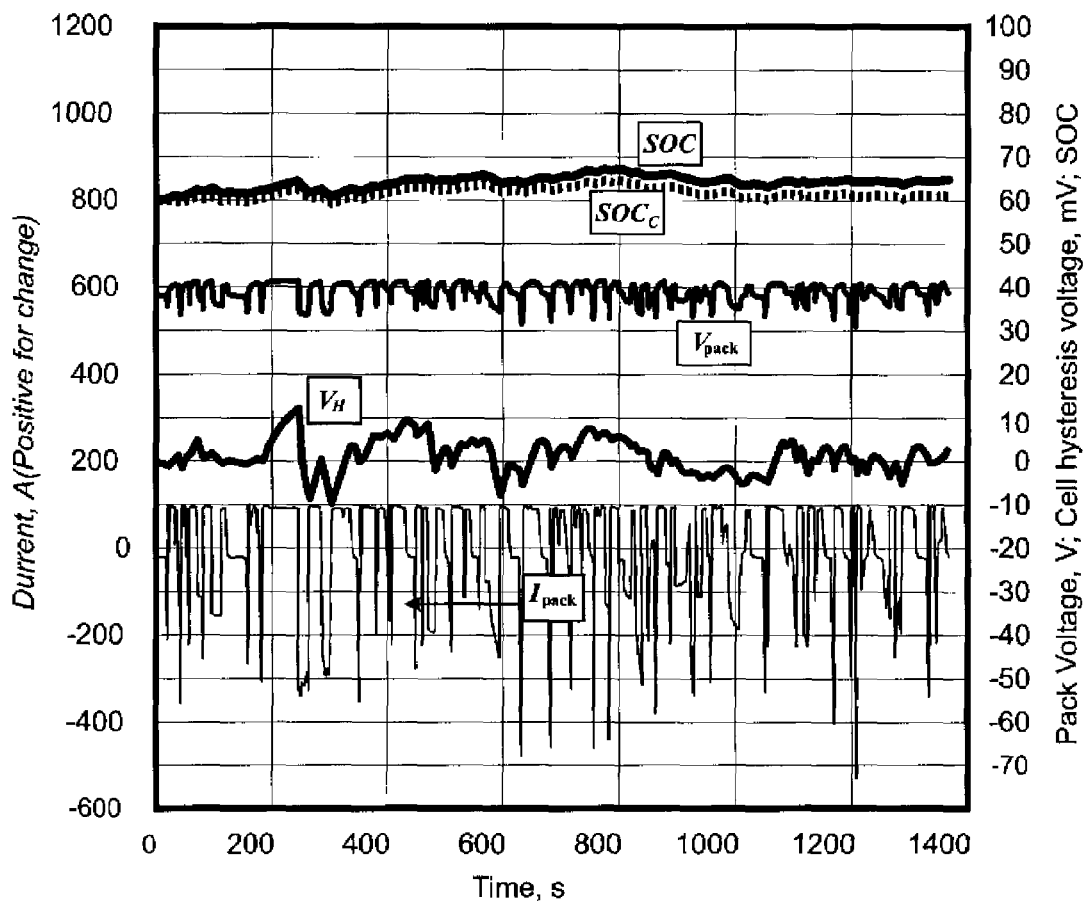
FIG. 4 depicts a result for SOC and related values.
Figure 5:
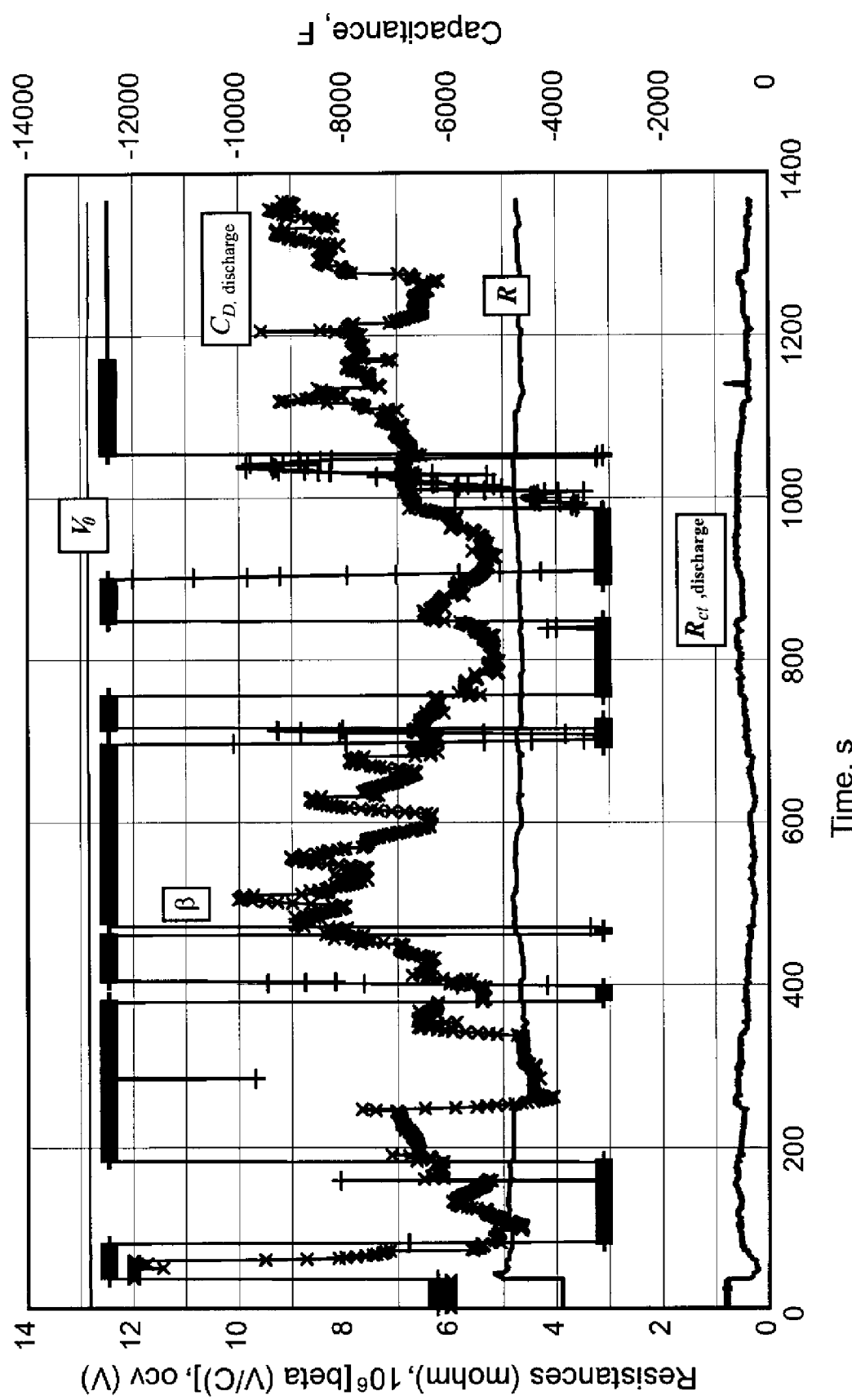
FIG. 5 depicts electro-chemical parameters extracted from a five parameter method.
Figure 6:
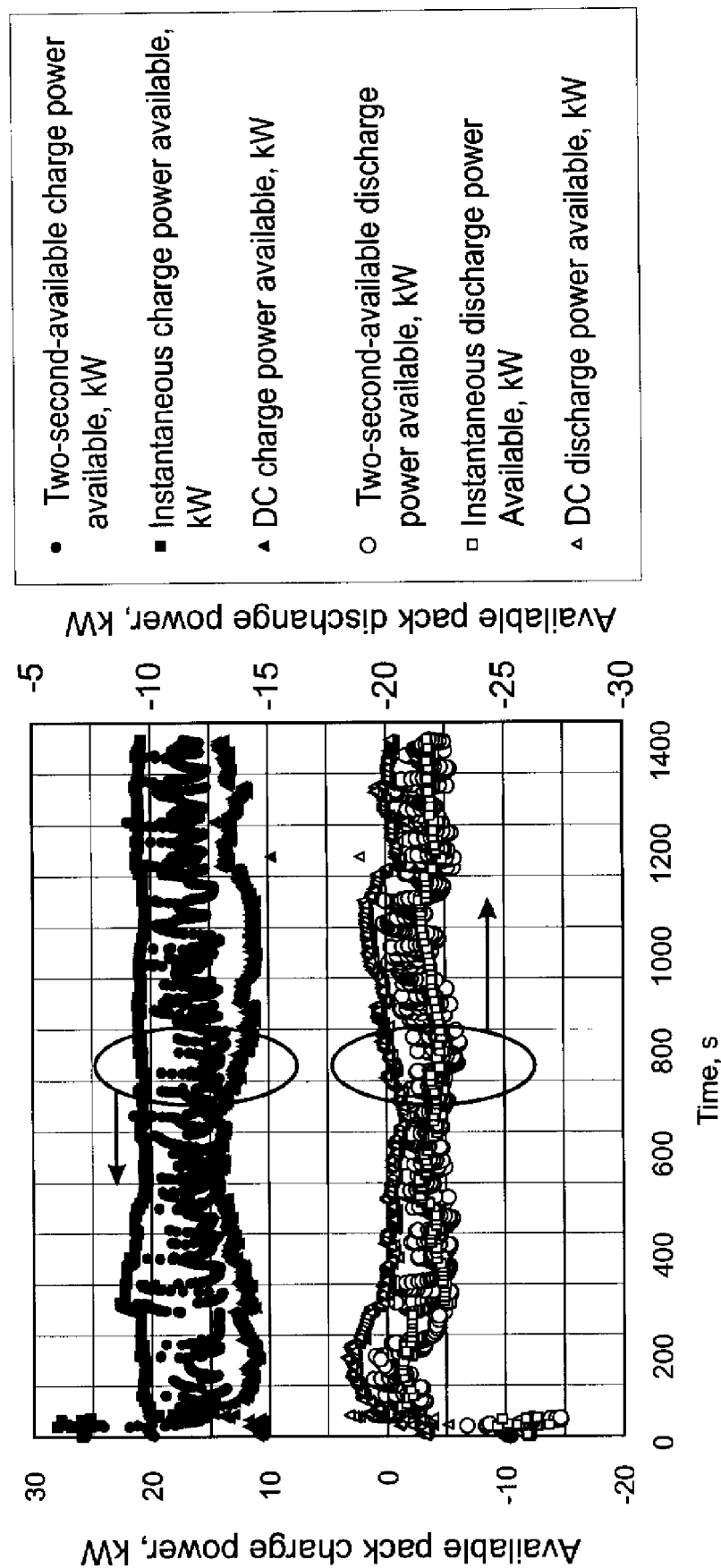
FIG. 6 depicts power capability results for a five parameter method.

Experimental results for a five-parameter method are presented in FIGS. 4-6. The algorithm results shown as examples of implementation come from a battery pack comprising three 12-V lead acid batteries. As is indicated by the results shown in FIG. 4, the parameters oscillate about the predetermined values (specified at t=0). The curve labeled $SOC_C$ (SOC by pure Coulomb integration throughout the test) corresponds to $w_{SOC}=1$ from start to finish. The importance of this curve is that the final SOC of the battery system after the test vector shown is found to be 64% (ascertained by low current discharge at the end of the test).

Because the test vector was nearly charge neutral (little overall net charge or discharge), we infer that the correct SOC is near 65% throughout the test. The starting SOC was set to 60% for the method. The average error in the voltage response was less than 0.1% for the conditions presented. The overall conclusions we can draw from the specific analysis of through are that (i) the voltage response is well represented by the method, (ii) sufficient accuracy with respect to SOC determination is obtained, and (iii) the parameters are sufficiently stable in that they do not undergo substantial deviations from their base values.

Figure 7:
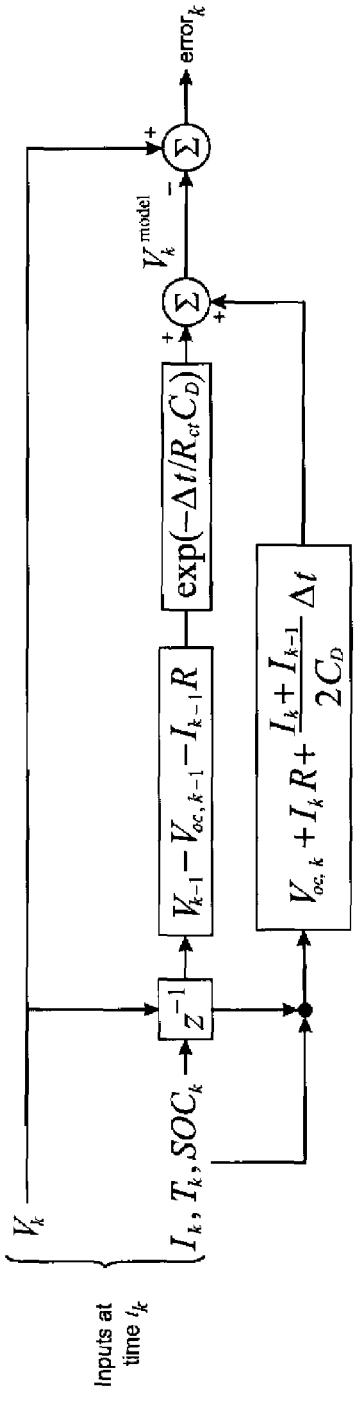
FIG. 7 is an overview of a voltage-based portion of the present invention.
Figure 8:
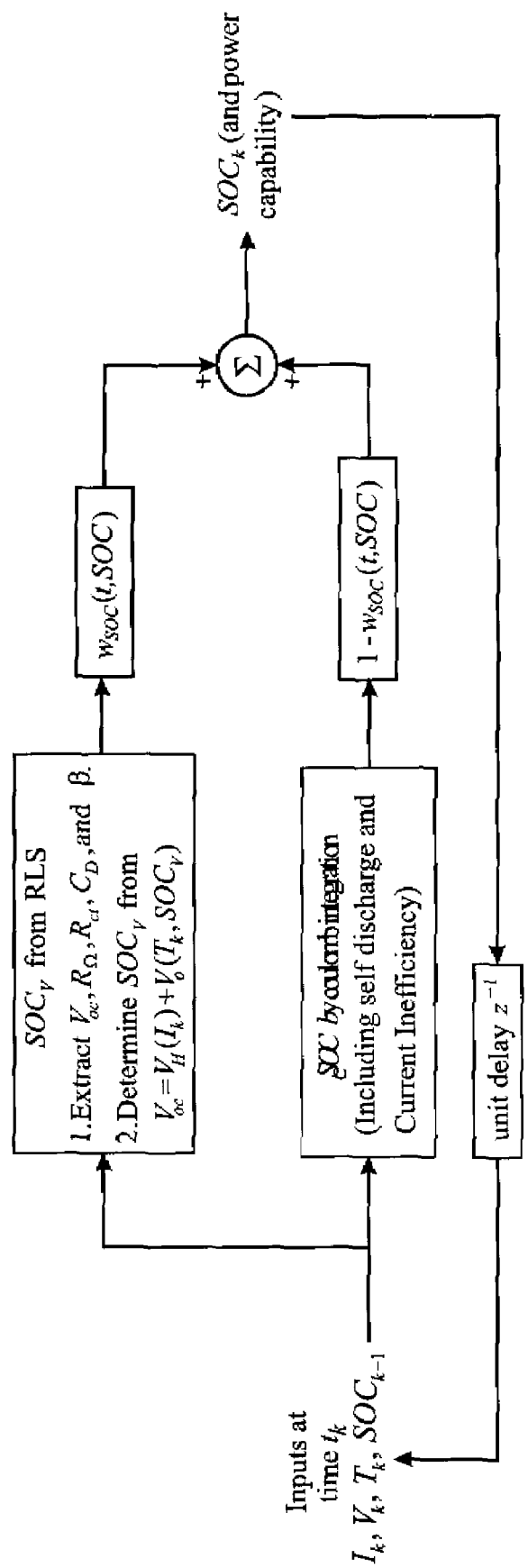
FIG. 8 is an overview of a combination of the voltage-based and Coulomb integration portions of the present invention.

The predicted power capability for charge and discharge throughout the test vector is displayed in FIG. 6, where it is seen that because the high-frequency resistance R is the same for charge and discharge, the high frequency power capability for charge and discharge is similar in magnitude. In contrast, lower charge power magnitudes are obtained (relative to discharge) at lower frequencies. The effect of the small charge capacitance $C_{D,charge}$ is seen to lead to a fall off in the power available for charge during a sustained period of charging (see, for example, the fall off in power during the sustained charge event between 195 and 240 s). For the power capability calculations, $V_{min}$=27 V, $V_{max}$=45 V, and $\Delta t$=2 s. FIGS. 7 and 8 provide schematic overviews of the 5-parameter method. Specifically, FIG. 7 provides an overview of a voltage-based portion, and FIG. 8 provides a combination of the voltage based and a Coulomb integration portions of a method.

It is noted that the five parameter example supra is provided as an example in a generalized approach, wherein WRLS is used for the determination of a battery's SOC and SOH. The derived, generalized procedure is exemplified by using a five-parameter regression, which provides a means to comprehend in a straightforward manner the generality of the approach. Any number of parameters can be modeled using the instant method.

The benefit of using the five parameter example is that it demonstrates the regression of each term within the equivalent circuit; that is, the five circuit elements (open circuit voltage, hysteresis voltage, the two resistors, and the capacitor) values are regressed adaptively. The formalism of the approach, embodied in the matrix systems of equations, is constructed such that any and all parameters required to define the state of a battery system can be regressed adaptively.

One embodiment of the invention is implemented as a program product for use with a computer system such as, for example, energy management controller 40, or hybrid system controller 50 with features described below. The program(s) of the program product defines functions of the embodiments including the methods described below with reference to FIG. 3 and can be contained on a variety of signal-bearing media. Illustrative signal-bearing media include, but are not limited to, (i) information permanently stored on non-storage media (e.g., read-only memory devices within a computer such as CD-ROM disks readable by a CD-ROM drive); (ii) alterable information stored on writable storage media (e.g., floppy disks within a diskette drive or hard-disk drive); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct the functions of the present invention, represent embodiments of the present invention.

In general, the routines executed to implement the embodiments of the invention, whether implemented as part of an operating system or a specific application, component, program, module, object, or sequence of instructions may be referred to herein as a "program". The computer program typically is comprised of a multitude of instructions that will be translated by the native computer into a machine-readable format and hence executable instructions. Further, programs are comprised of variables and data structures that either reside locally to the program, or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

While the invention has been described by reference to certain preferred embodiments, it should be understood that numerous changes could be made within the spirit and scope of the inventive concepts described. Accordingly, it is intended that the invention not be limited to the disclosed embodiments, but that it have the full scope permitted by the language of the following claims.

The invention claimed is:

1. A method for determining a state of charge (SOC) or state of health (SOH) of a battery system, comprising:
performing a first step including determining a set of initial values for a plurality of parameters, coefficients, and derivatives based upon a plurality of linear functional relationships, and computing a result based upon said determining;
after execution of said first step, calculating a plurality of intermediate functions based on said result;
updating said plurality of parameters based on said plurality of intermediate functions;
determining an open circuit voltage $V_{OC}$ that possesses a functional relationship with a voltage-based SOC ($SOC_V$) based on said updated plurality of parameters;
extracting said $SOC_V$ by inverting an expression of $V_O(SOC_V)$;
calculating a current based SOC ($SOC_C$);
calculating a weight for weighting said $SOC_C$ and said $SOC_V$; and
calculating a SOC based on said weight,
where $V_O$ is a battery voltage.

2. The method of claim 1, wherein said step of calculating $SOC_C$ is based upon the following equation:

$$SOC_C(t) = SOC_{t-\Delta t} + \left[\frac{100}{Ah_{nominal}}\left\{\frac{(\eta_I I)_{t-\Delta t} + (\eta_I I)_t}{2}\right\} - S_D\right]\frac{\Delta t}{3600}$$

where $\eta_I$ is current efficiency, I is electric current, $S_D$ is self-discharge rate, and $Ah_{nominal}$ is nominal capacity.

3. The method of claim 1, wherein said step of calculating SOC is based upon the following equation:

$$SOC = w_{SOC}(SOC_c) + (1-w_{SOC})(SOC_V)$$

where $w_{SOC}$ is a SOC weighting factor.

4. The method of claim 1, wherein said step of calculating a weight for weighting $SOC_C$ and $SOC_V$ is based upon the following equation and a table:

$$w_{SOC} = 1 - \alpha(\Delta t)$$

where $w_{SOC}$ is a SOC weighting factor and $\alpha$ is a time increment dependent quantity.

5. The method of claim 4, wherein the weighting factor $w_{SOC}$ is to be bounded between 0 and 1, and where $w_{SOC}$ is a SOC weighting factor.

6. The method of claim 1, wherein said step of extracting $SOC_V$ by inverting the expression of $V_O(SOC_V)$ includes using a lookup table (LUT).

7. The method of claim 1, wherein said step of determining a open circuit voltage $V_O$ is based upon the following equation:

$$V_{oc} = V_o(T, SOC_V) + V_H$$

where T is temperature and $V_H$ is hysteresis voltage.

8. The method of claim 1, wherein said battery system comprises a five parameter system.

9. The method of claim 1, wherein said step of updating said plurality of parameters is based upon the following equation:

$$Y = \begin{bmatrix} V_{y,1} \\ V_{y,2} \\ V_{y,3} \\ \vdots \\ V_{y,L} \end{bmatrix}, m = \begin{bmatrix} m_1 \\ m_2 \\ m_3 \\ \vdots \\ m_L \end{bmatrix}; \text{ and } X = \begin{bmatrix} V_{1,1} & V_{1,2} & V_{1,3} & \cdots & V_{1,L} \\ V_{1,2} & V_{2,2} & V_{2,3} & \cdots & V_{2,L} \\ V_{1,3} & V_{2,3} & V_{3,3} & \cdots & V_{3,L} \\ \vdots & \vdots & \vdots & \ddots & \vdots \\ V_{1,L} & V_{2,L} & V_{3,L} & \cdots & VL,L \end{bmatrix}$$

wherein each of elements of Y and X is computed to its respective updated version, where y is a coefficient value, m is a parameter, and L is a finite number.

10. The method of claim 1, wherein said step of calculating a plurality of intermediate functions is based upon the following equations:

$$s_{w,s}|_N = \sum_{j=1}^{N} \lambda^{N-j} = 1 + \lambda \sum_{j=1}^{N} j \lambda^{N-1-j} = 1 + \lambda(s_{w,s}|_{N-1})$$

$$S_{I,s}|_N = \frac{1}{\sum_{j=1}^{N} \lambda^{N-j}} \sum_{j=1}^{N} \lambda^{N-j} I_j = \frac{I_N + \lambda(s_{I,s}|_{N-1})(s_{w,s}|_{N-1})}{(s_{w,s}|_N)}$$

$$S_{II,s}|_N = \frac{1}{\sum_{j=1}^{N} \lambda^{N-j}} \sum_{j=1}^{N} \lambda^{N-j} I_j^2 = \frac{I_N^2 + \lambda(s_{II,s}|_{N-1})(s_{w,s}|_{N-1})}{(s_{w,s}|_N)}$$

and $$V_{uv}|_N = \left( s_{u,v}|_N - \frac{s_u|_N s_v|_N}{s_w|_N} \right) \frac{1}{s_w|_N}$$

where s is a skew value, $\lambda$ is a time-weighting factor, $\lambda^{N-j}$ is an exponential delay, I is electric current, u and v refer to coefficient values, and w is a weighting factor.

11. The method of claim 1, wherein said initializing step includes obtaining stored values of parameters obtained from prior analysis.

12. The method of claim 1, wherein said initializing stop includes obtaining coefficient values from initial values for battery voltage and current.

13. The method of claim 1, wherein said initializing step includes computing initial intermediate functions based upon the following equations:

$$s_w|_1 = \gamma_1$$

$$s_u|_1 = \gamma_1 u_1$$

$$s_{u,v}|_1 = \gamma_1 u_1 v_1$$

and $$s_{w,s}|_1 = 1$$

$$s_{I,s}|_1 = I_1$$

$$S_{II,s}|_1 = I_1^2$$

where s is a skew value, I is electric current, u and v refer to coefficient values, w is a weighting factor, and $\gamma$ is a charge parameter.

14. The method of claim 1, wherein the parameters satisfy the following matrix relationship:

$$Xm = Y$$

where $$Y = \begin{bmatrix} V_{y,1} \\ V_{y,2} \\ V_{y,3} \\ \vdots \\ V_{y,L} \end{bmatrix}; m = \begin{bmatrix} m_1 \\ m_2 \\ m_3 \\ \vdots \\ m_L \end{bmatrix}; \text{ and } X = \begin{bmatrix} V_{1,1} & V_{1,2} & V_{1,3} & \cdots & V_{1,L} \\ V_{1,2} & V_{2,2} & V_{2,3} & \cdots & V_{2,L} \\ V_{1,3} & V_{2,3} & V_{3,3} & \cdots & V_{3,L} \\ \vdots & \vdots & \vdots & \ddots & \vdots \\ V_{1,L} & V_{2,L} & V_{3,L} & \cdots & V_{L,L} \end{bmatrix}.$$

15. The method of claim 1, including:

determining a first value based upon a skewness test; and based upon said value, determining a course of action including discarding voltage based $SOC_V$, and using current based $SOC_C$ as an indication of a SOC of said battery system.

16. The method of claim 1, including:

determining a second value based upon a determinant test; and based upon said value, determining a course of action.

17. The method of claim 1 including computing a recursive power expression based on said data points.

18. The method of claim 17, wherein said power expression is a max discharge and charge power of said battery system.

* * * * *